(12) United States Patent
Wei et al.

(10) Patent No.: US 9,576,835 B2
(45) Date of Patent: *Feb. 21, 2017

(54) WORKPIECE PROCESSING METHOD

(71) Applicant: DISCO CORPORATION, Tokyo (JP)

(72) Inventors: Frank Wei, Tokyo (JP); Hiroshi Morikazu, Tokyo (JP); Nao Hattori, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/531,477

(22) Filed: Nov. 3, 2014

(65) Prior Publication Data

US 2015/0136312 A1 May 21, 2015

(30) Foreign Application Priority Data

Nov. 15, 2013 (JP) .................................. 2013-236374

(51) Int. Cl.
*B29C 65/14* (2006.01)
*B29C 65/16* (2006.01)
(Continued)

(52) U.S. Cl.
CPC ....... *H01L 21/6835* (2013.01); *H01L 21/6836* (2013.01); *H01L 23/544* (2013.01);
(Continued)

(58) Field of Classification Search
CPC .................. H01L 2924/0002; H01L 2924/00; H01L 21/6835; H01L 21/6836; H01L 2221/68327; H01L 2221/6834; H01L 2221/68381; H01L 2223/54493; H01L 2224/11; H01L 23/544
(Continued)

(56) References Cited

U.S. PATENT DOCUMENTS 3,698,080 A * 10/1972 Berner .................... H01L 21/00
148/DIG. 18
6,235,141 B1 * 5/2001 Feldman .............. G02B 6/4214
156/250

(Continued)

FOREIGN PATENT DOCUMENTS

JP     05-198542     8/1993
JP     2004-207606   7/2004

OTHER PUBLICATIONS

English translation of JP2004-207606.*
English translation of JP05-198542.*

*Primary Examiner* — Sing P Chan
(74) *Attorney, Agent, or Firm* — Green Burns & Crain, Ltd.

(57) ABSTRACT

A method for processing a workpiece including: a supporting plate preparing step of preparing a supporting plate having, on a top surface side of the supporting plate, a recessed portion configured to house a projecting portion provided in a device region of the workpiece; a positioning step of mounting the workpiece on the supporting plate such that the recessed portion of the supporting plate and the device region of the workpiece correspond to each other; a bonding step of forming a welded region in which the workpiece is welded to the supporting plate by irradiating a peripheral surplus region of the workpiece mounted on the supporting plate with a laser beam, whereby the workpiece is fixed on the supporting plate; and a processing step of processing the workpiece after performing the bonding step.

8 Claims, 10 Drawing Sheets

(51) Int. Cl.
  *B32B 37/06* (2006.01)
  *B32B 38/04* (2006.01)
  *B32B 38/10* (2006.01)
  *B32B 43/00* (2006.01)
  *H01L 21/00* (2006.01)
  *H01L 21/30* (2006.01)
  *H01L 21/46* (2006.01)
  *H01L 21/304* (2006.01)
  *H01L 21/683* (2006.01)
  *H01L 23/544* (2006.01)

(52) U.S. Cl.
  CPC ............. *H01L 2221/6834* (2013.01); *H01L 2221/68327* (2013.01); *H01L 2221/68381* (2013.01); *H01L 2223/54493* (2013.01); *H01L 2224/11* (2013.01); *H01L 2924/0002* (2013.01)

(58) Field of Classification Search
  USPC ...... 438/113, 455–460; 156/272.8, 250–268, 156/701, 717
  See application file for complete search history.

(56) References Cited

U.S. PATENT DOCUMENTS

| | | | |
|---|---|---|---|
| 6,352,935 B1 * | 3/2002 | Collins | H01L 21/50 257/E21.499 |
| 7,994,026 B2 * | 8/2011 | Harikai | H01J 37/32743 257/E21.214 |
| 8,580,655 B2 * | 11/2013 | Martin | H01L 21/67092 257/E23.02 |
| 9,446,479 B2 * | 9/2016 | Wei | H01L 21/67092 |
| 2005/0014347 A1 * | 1/2005 | Tomita | H01L 21/76251 438/459 |
| 2005/0079664 A1 * | 4/2005 | Faris | B81C 1/00238 438/200 |
| 2006/0014330 A1 * | 1/2006 | Ichikawa | H01L 21/76254 438/149 |
| 2006/0276010 A1 * | 12/2006 | Bradl | H01L 21/6704 438/464 |
| 2007/0056684 A1 * | 3/2007 | Yamamoto | B29C 65/1635 156/272.8 |
| 2007/0249145 A1 * | 10/2007 | Nakamura | H01L 21/67092 438/464 |
| 2008/0014715 A1 * | 1/2008 | Leitner | H01L 21/6835 438/458 |
| 2009/0130821 A1 * | 5/2009 | Cox | H01L 23/544 438/455 |
| 2010/0148282 A1 * | 6/2010 | Donis | B81C 1/00269 257/414 |
| 2011/0057331 A1 * | 3/2011 | Hayashi | C09J 7/0246 257/783 |
| 2012/0288995 A1 * | 11/2012 | El-Ghoroury | H01L 27/14618 438/107 |

* cited by examiner

WORKPIECE PROCESSING METHOD

BACKGROUND OF THE INVENTION

Field of the Invention

The present invention relates to a processing method for processing a plate-shaped workpiece typified by a semiconductor wafer.

Description of the Related Art

When the undersurface side of a workpiece typified by a semiconductor wafer which workpiece is provided with a device on the top surface side thereof is processed, a protective tape for protecting the device on the top surface side may be used (see for example Japanese Patent Laid-Open No. Hei 5-198542). The protective tape is formed by a base material and a glue layer on the base material. The protective tape is stuck to the top surface side of the workpiece by the adhesive force of a glue included in the glue layer.

In addition, a supporting plate that supports a workpiece may be used to prevent damage such as cracking, chipping, and the like at a time of processing (see for example Japanese Patent Laid-Open No. 2004-207606). The supporting plate has a rigidity necessary to support the workpiece. The supporting plate is stuck to the top surface side of the workpiece by an adhesive including a thermoplastic or thermosetting resin.

SUMMARY OF THE INVENTION

The thickness of the base material and the glue layer forming the protective tape varies to some extent. Thus, when the top surface side of the protective tape provided with the glue layer is stuck to the top surface side of the workpiece, for example, a distance from the undersurface of the protective tape to the undersurface of the workpiece is not uniform in the plane of the workpiece. Similarly, because of a difficulty in making the adhesive interposed between the supporting plate and the workpiece have a uniform thickness, when the top surface side of the supporting plate is stuck to the top surface side of the workpiece, for example, a distance from the undersurface of the supporting plate to the undersurface of the workpiece is not uniform in the plane of the workpiece.

When the distance from the undersurface of the protective tape or the undersurface of the supporting plate to the undersurface of the workpiece, the undersurface of the workpiece being a processing object surface, is thus not uniform, variations occur in height position of the undersurface of the workpiece in a state of being retained by a holding table of a processing apparatus. When the workpiece is subjected to grinding processing in a state in which the height position of the undersurface as a processing object surface of the workpiece varies, the finished thickness of the workpiece cannot be made uniform.

In addition, when the protective tape or the supporting plate is removed from the workpiece after being processed, part of the glue or the adhesive may remain on the workpiece. Particularly when a protective tape or a supporting plate is stuck to the top surface side of a workpiece provided with minute structures such as MEMSs or projections such as bumps (projecting electrodes), a glue or an adhesive may remain on projections and depressions that are formed due to the structures or the projections, and may thus cause a device failure.

It is accordingly an object of the present invention to provide a processing method that can suppress variations in height position of a processing object surface and prevent the remaining of a glue or an adhesive.

In accordance with an aspect of the present invention, there is provided a method for processing a workpiece, the workpiece including a device region having a device formed on a top surface of the device region and a peripheral surplus region surrounding the device region, the workpiece having a projecting portion in the device region, the method including: a supporting plate preparing step of preparing a supporting plate having, on a top surface side of the supporting plate, a recessed portion configured to correspond to the device region of the workpiece and house the projecting portion; a positioning step of mounting the workpiece on the supporting plate such that the recessed portion of the supporting plate and the device region of the workpiece correspond to each other; a bonding step of forming a welded region in which the workpiece is welded to the supporting plate by irradiating the peripheral surplus region of the workpiece mounted on the supporting plate with a laser beam, whereby the workpiece is fixed on the supporting plate; and a processing step of processing the workpiece after performing the bonding step.

In addition, in the present invention, preferably, the processing method further includes a removing step of removing the workpiece from the supporting plate by forming a dividing groove dividing the workpiece along the welded region after performing the processing step, wherein in the removing step, the dividing groove is formed such that an inner circumference of the dividing groove is positioned closer to a central side of the workpiece than an inner circumference position of the welded region.

In addition, in the present invention, preferably, in the bonding step, the welded region is formed in the peripheral surplus region of the workpiece by irradiating the peripheral surplus region of the workpiece with the laser beam from an undersurface of the workpiece mounted on the supporting plate such that a focusing point of the laser beam is positioned at an interface between the workpiece and the supporting plate.

In addition, in the present invention, preferably, the welded region is a region including a side surface of the workpiece mounted on the supporting plate.

According to the present invention, the welded region in which the workpiece and the supporting plate are welded to each other is formed by irradiating the peripheral surplus region of the workpiece mounted on the supporting plate with the laser beam. Therefore the workpiece can be fixed on the supporting plate without the use of a glue layer or an adhesive. It is accordingly possible to suppress variations in height position of a processing object surface which variations are attendant on the use of a glue layer or an adhesive. In addition, it is possible to prevent the remaining of a glue or an adhesive on the workpiece.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

An embodiment of the present invention will hereinafter be described with reference to the accompanying drawings. It is to be noted that while description will be made of a processing method in which a wafer having devices and bumps (projecting portions) formed on a top surface side of the wafer is a workpiece in the present embodiment, the present invention is not limited to this. For example, a wafer having arbitrary structures or projections provided on a top surface side of the wafer and the like may be a workpiece.

Figure 5:
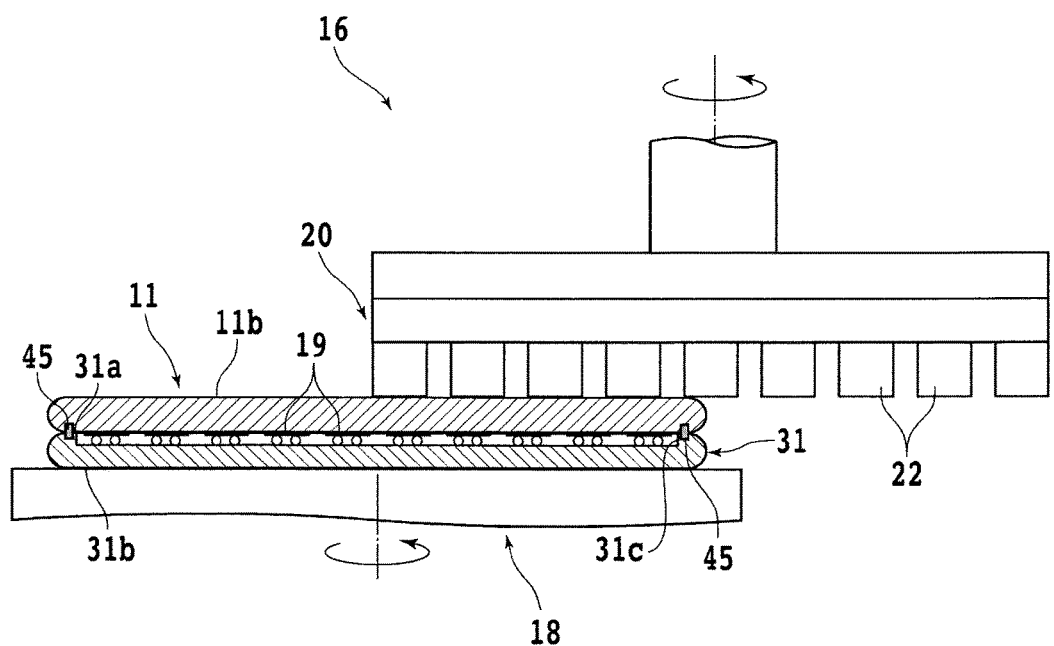
FIG. 5 is a partially sectional side view schematically showing a processing step.
Figure 6A:
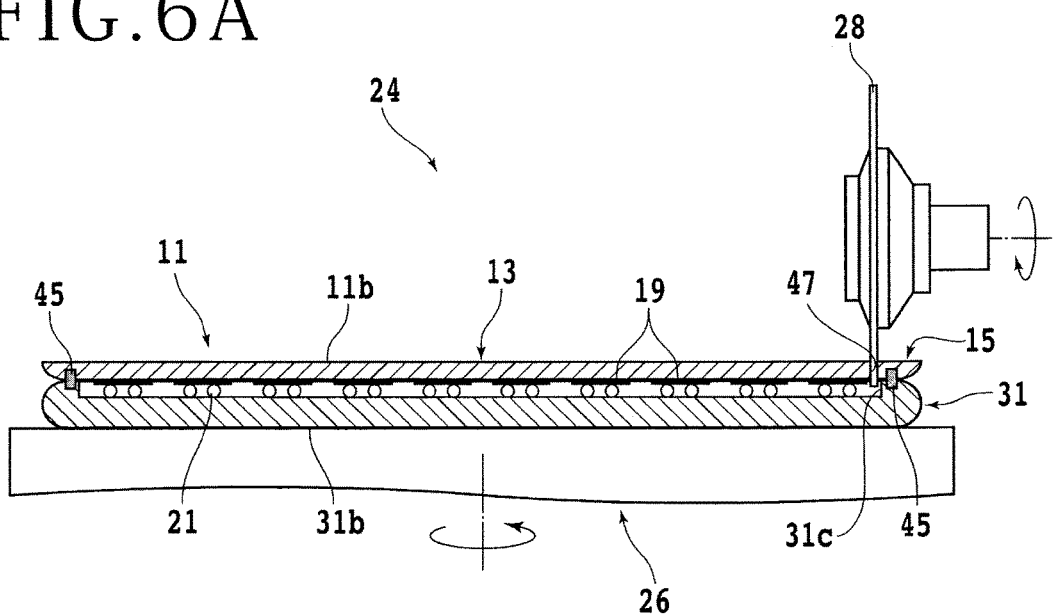
FIG. 6A and FIG. 6B are partially sectional side views schematically showing a first mode of a removing step.
Figure 6B:
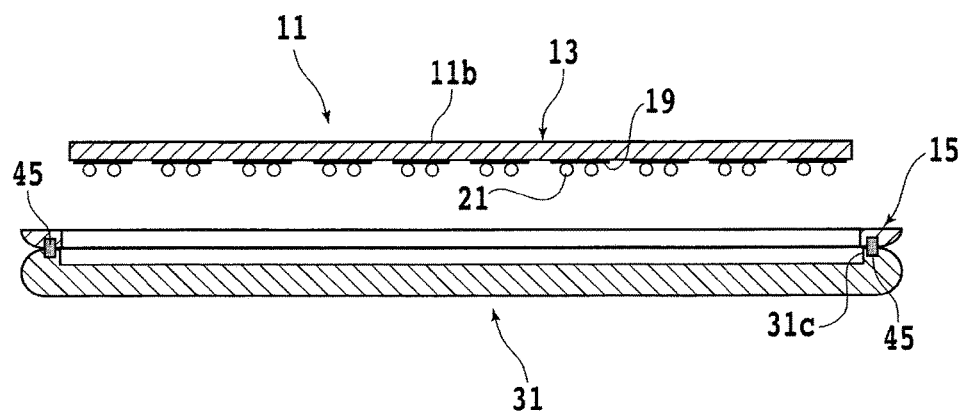

A processing method according to the present embodiment includes a supporting plate preparing step (see FIG. 1A, FIG. 1B, and FIG. 2), a positioning step (see FIG. 3), a bonding step (see FIG. 4A, FIG. 4B, and FIG. 4C), a processing step (see FIG. 5), and a removing step (see FIG. 6A and FIG. 6B). In the supporting plate preparing step, a supporting plate in which a recessed portion corresponding to a device region of a workpiece (wafer) is formed is prepared. In the positioning step, the workpiece is mounted on the supporting plate such that the recessed portion of the supporting plate and the device region of the workpiece correspond to each other. In the bonding step, a peripheral surplus region of the workpiece is irradiated with a laser beam to weld and fix the workpiece and the supporting plate to each other. In the processing step, the workpiece fixed to the supporting plate is processed. In the removing step, the workpiece is divided and removed from the supporting plate. The steps and the like of the processing method according to the present embodiment will be described in detail.

Figure 1A:
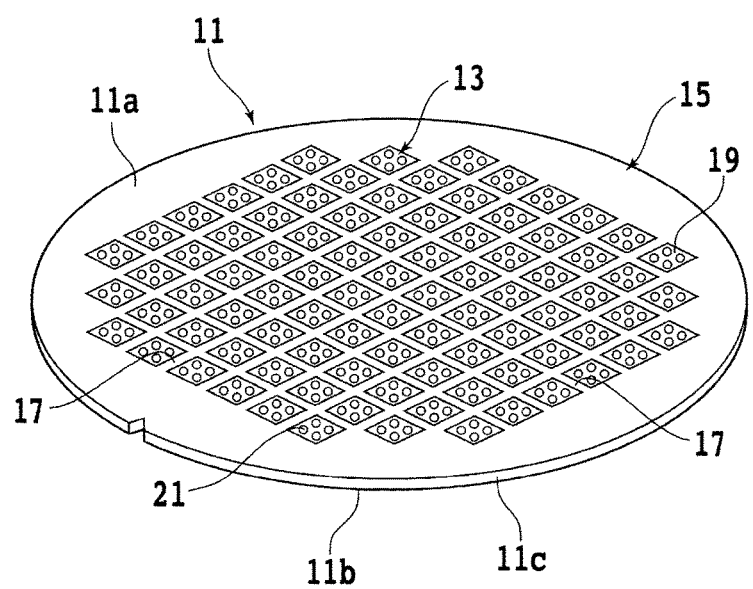
FIG. 1A is a perspective view schematically showing an example of constitution of a wafer processed by a processing method according to the present embodiment.
Figure 1B:
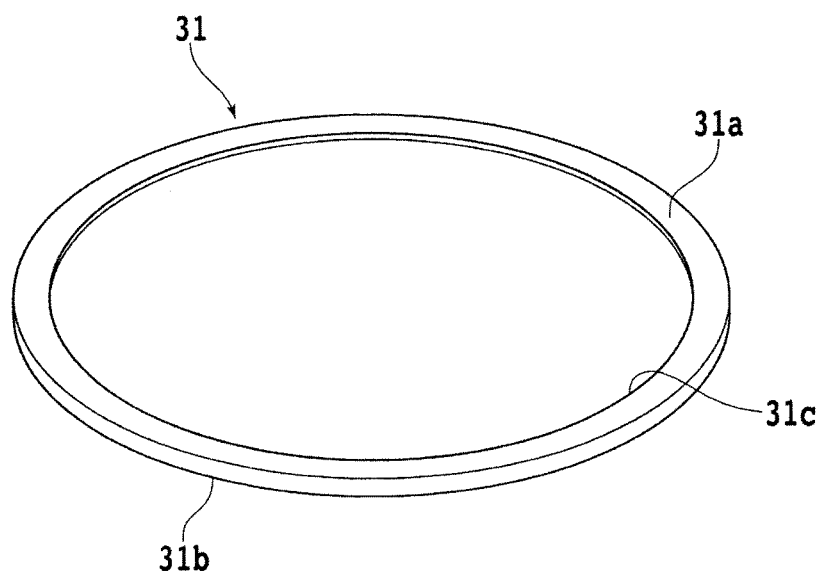
FIG. 1B is a perspective view schematically showing an example of constitution of a supporting plate for supporting the wafer in the processing method according to the present embodiment.

FIG. 1A is a perspective view schematically showing an example of constitution of the workpiece processed by the processing method according to the present embodiment. FIG. 1B is a perspective view schematically showing an example of constitution of the supporting plate for supporting the workpiece in the processing method according to the present embodiment. As shown in FIG. 1A, the workpiece 11 is for example a semiconductor wafer in the shape of a disk. A top surface 11a of the workpiece 11 is divided into a central device region 13 and a peripheral surplus region 15 surrounding the device region 13. However, the workpiece 11 is not limited to the semiconductor wafer, but may be a glass substrate, a sapphire substrate, or the like.

The device region 13 is further partitioned into a plurality of regions by streets (predetermined division lines) 17 arranged in the form of a lattice. A device 19 such as an IC is formed in each region. The outer circumference (side surface) 11c of the workpiece 11 is chamfered, and thus has an arcuate sectional shape. A plurality of bumps (projecting portions) 21 are arranged on each device 19. The bumps 21 are for example substantially spherical solder balls, and are connected to electrode pads of the respective devices 19. Incidentally, while FIG. 1A illustrates a constitution in which four bumps 21 are arranged on each device 19, the number, arrangement, size, and the like of the bumps 21 are arbitrary.

In the processing method according to the present embodiment, the supporting plate preparing step of preparing the supporting plate for supporting the workpiece 11 as described above is performed first. As shown in FIG. 1B, the supporting plate 31 used in the processing method according to the present embodiment is typically a planar object in the form of a disk having a same diameter as the workpiece 11, and has a rigidity necessary to support the workpiece 11. A recessed portion 31c corresponding to the device region 13 of the workpiece 11 is formed on the side of the top surface 31a of the supporting plate 31. The recessed portion 31c is formed to such a depth as to be able to house the bumps 21 in a state in which the top surface 11a of the workpiece 11 and the top surface 31a of the supporting plate 31 are laid one on top of the other so as to face each other. That is, a distance between the bottom of the recessed portion 31c and the top surface 31a of the supporting plate 31 is slightly larger than the size (diameter) of the bumps 21.

Figure 2:
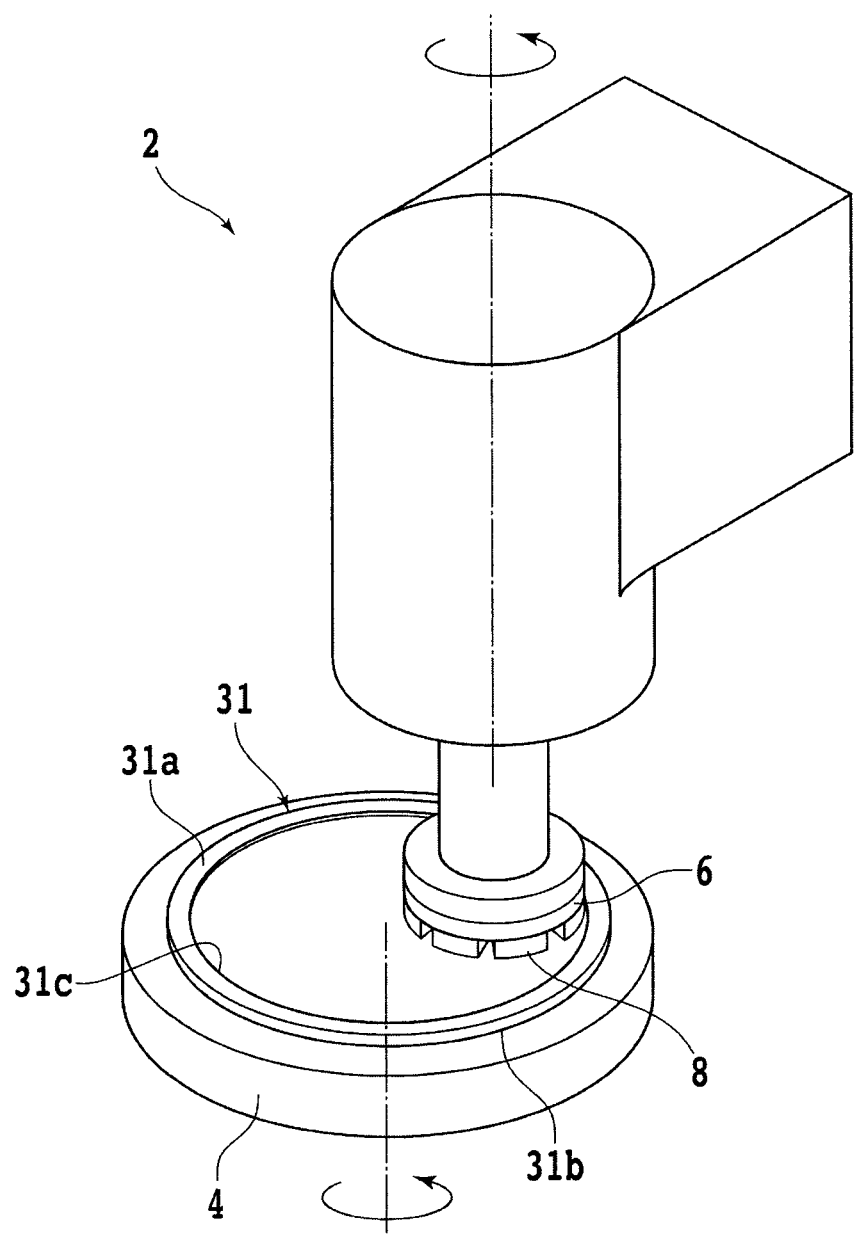
FIG. 2 is a perspective view schematically showing a supporting plate preparing step.

The supporting plate 31 is formed by grinding a planar object in the form of a flat disk, for example. FIG. 2 is a perspective view schematically showing the supporting plate preparing step. In the supporting plate preparing step, first, as shown in FIG. 2, the undersurface 31b of the supporting plate 31 is sucked onto a holding table 4 of a grinding apparatus 2. Next, a grinding stone 8 of a grinding wheel 6 is brought into contact with the top surface 31a of the supporting plate 31 while the holding table 4 and the grinding wheel 6 are rotated relative to each other. Suppose in this case that a region that the grinding stone 8 is brought into contact with is the central region of the supporting plate 31 which central region corresponds to the device region 13 of the workpiece 11. The supporting plate 31 is ground by gradually lowering the grinding wheel 6 in this state, whereby the recessed portion 31c can be formed around a center on the side of the top surface 31a. Incidentally, the grinding wheel 6 used in the supporting plate preparing step has a smaller diameter than the supporting plate 31.

A material for the supporting plate 31 is not particularly limited, but is preferably the same as a material for the workpiece 11. When a silicon wafer is used as the workpiece 11, for example, a silicon wafer is preferably used also as the supporting plate 31. Thus using a material common to the workpiece 11 and the supporting plate 31 enables the workpiece 11 and the supporting plate 31 to be welded to each other properly in a subsequent bonding step without greatly increasing processing cost. However, the constitution of the supporting plate 31 is not limited to this. A rigid plate that can be properly welded to the workpiece 11 in the subsequent bonding step can be used as the supporting plate 31. For example, a glass substrate or the like may be ground as described above, and used as the supporting plate 31.

Figure 3:
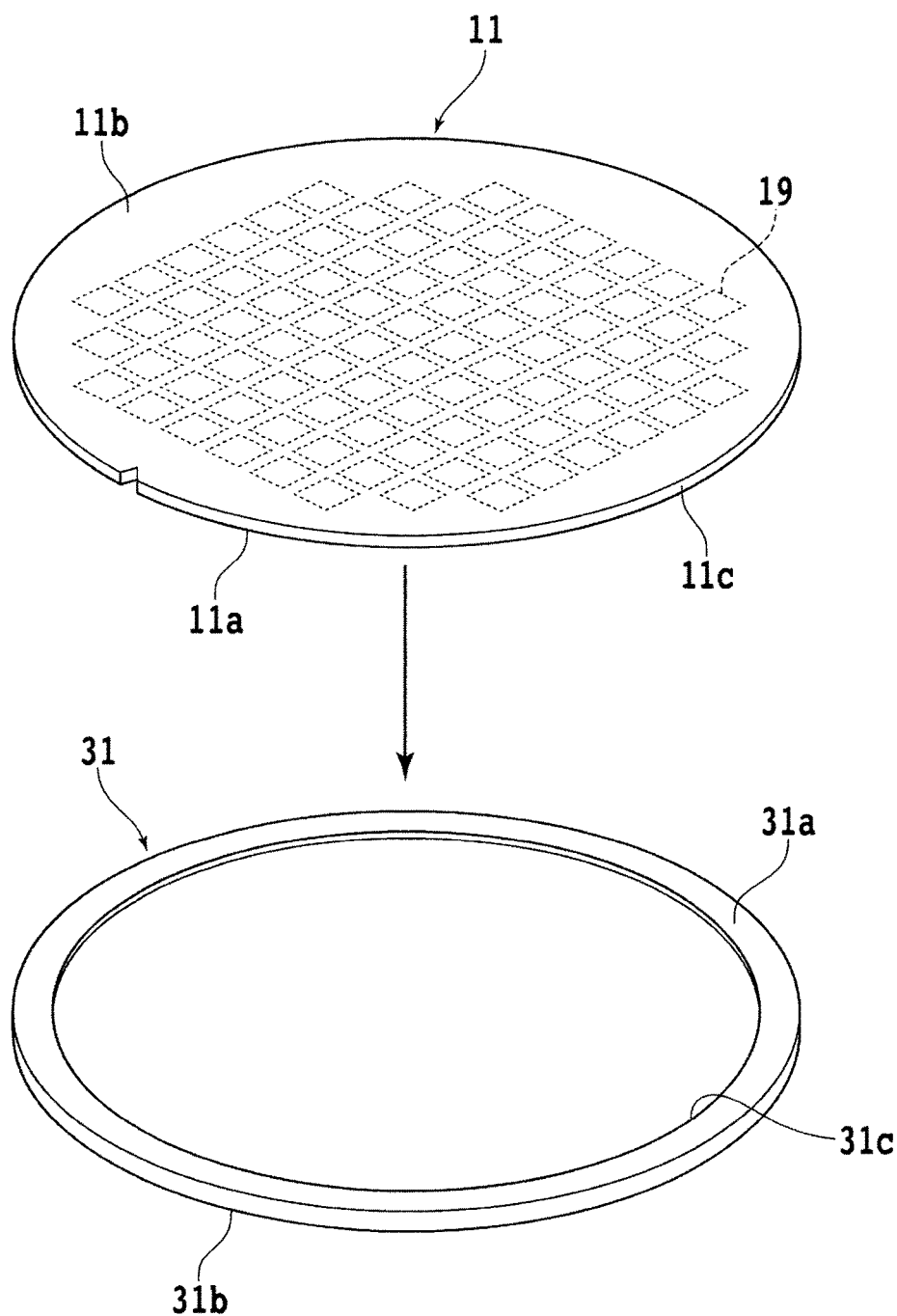
FIG. 3 is a perspective view schematically showing a positioning step.

After the supporting plate preparing step, the positioning step is performed in which the workpiece 11 is mounted on the supporting plate 31 such that the recessed portion 31c of the supporting plate 31 corresponds to the device region 13 of the workpiece 11. FIG. 3 is a perspective view schematically showing the positioning step. In this positioning step, first, the workpiece 11 is positioned above the supporting plate 31 such that the top surface 11a of the workpiece 11 and the top surface 31a of the supporting plate 31 described above are opposed to each other. At this time, the device region 13 of the workpiece 11 is superposed above the recessed portion 31c of the supporting plate 31. Next, the workpiece 11 and the supporting plate 31 are brought into proximity to each other, and the workpiece 11 is mounted on the supporting plate 31. Consequently, the top surface 11a of the workpiece 11 and the top surface 31a of the supporting plate 31 are in contact with each other, and the bumps 21 of the workpiece 11 are housed in the recessed portion 31c of the supporting plate 31.

Figure 4A:
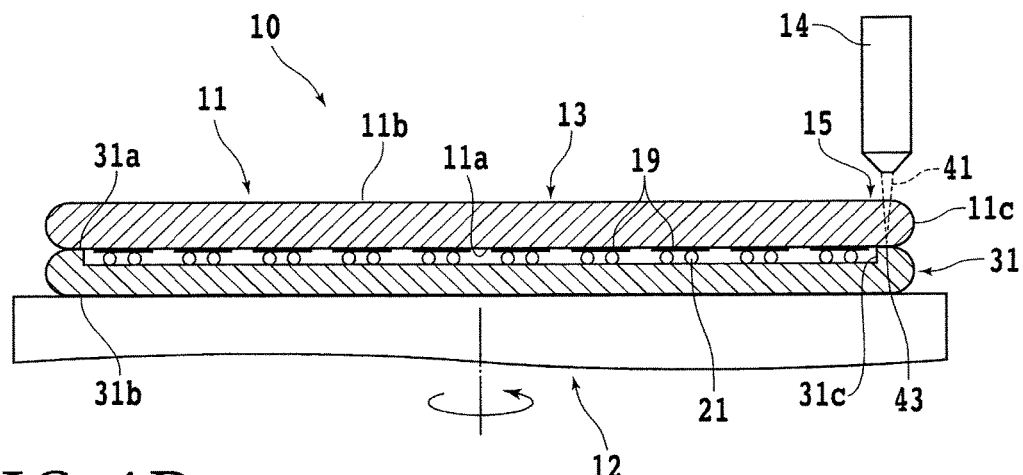
FIG. 4A and FIG. 4B are partially sectional side views schematically showing a first mode of a bonding step.
Figure 4B:
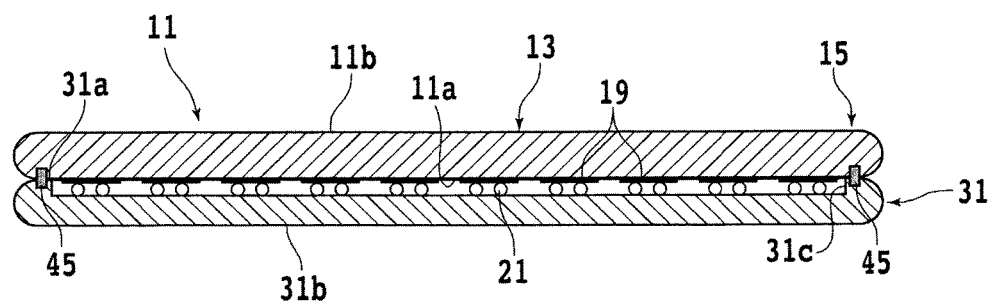
Figure 4C:
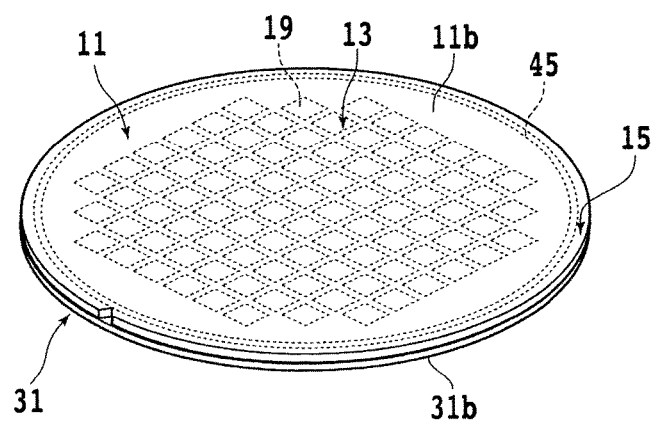
FIG. 4C is a perspective view schematically showing a state of the workpiece and the like after the bonding step according to the first mode is performed.

After the positioning step, the bonding step is performed in which the workpiece 11 is fixed to the supporting plate 31. FIG. 4A and FIG. 4B are partially sectional side views schematically showing the bonding step of the processing method according to the present embodiment. FIG. 4C is a perspective view showing a state of the workpiece 11 and the like after the bonding step is performed. Incidentally, a second mode of the bonding step which second mode will be described later can also be applied to the bonding step in place of a first mode of the bonding step which first mode is shown in FIGS. 4A to 4C.

As shown in FIG. 4A, in the bonding step, first, the undersurface 31b of the supporting plate 31 is sucked onto a holding table 12 of a laser processing apparatus 10 while positional relation between the workpiece 11 and the supporting plate 31 is maintained. Next, a laser processing head 14 is positioned above the peripheral surplus region 15 of the workpiece 11, and the workpiece 11 is irradiated with a laser beam 41 while the holding table 12 is rotated. The laser beam 41 is oscillated with for example YAG, YVO4, Er/Yb/Tm doped fiber or the like used as a laser medium. The undersurface 11b of the workpiece 11 which undersurface 11b is exposed upward is irradiated with the laser beam 41. In addition, a focusing point 43 of the laser beam 41 is positioned in the vicinity of an interface between the workpiece 11 and the supporting plate 31 (the top surface 11a and the top surface 31a). An optical system that condenses the laser beam 43 is preferably capable of a long focal length. The wavelength of the laser beam 41 is not particularly limited. However, the wavelength of the laser beam 41 is preferably such that the laser beam 41 is not easily absorbed by the workpiece 11. For example, when a silicon wafer is used as the workpiece 11, the laser beam 41 having a wavelength in an infrared region (for example a wavelength longer than 700 nm) is preferably used. When the laser beam 41 has such a wavelength, the absorption of the laser beam 41 within the workpiece 11 is suppressed, and thus the laser beam 41 having a sufficient intensity can be made to reach the vicinity of the interface between the workpiece 11 and the supporting plate 31.

As shown in FIG. 4B and FIG. 4C, when the vicinity of the interface between the workpiece 11 and the supporting plate 31 is irradiated with the laser beam 41 having a sufficient intensity, part of the side of the top surface 11a of the workpiece 11 and part of the side of the top surface 31a of the supporting plate 31 melt. As a result, a welded region 45 that welds the workpiece 11 and the supporting plate 31 to each other is formed in the peripheral surplus region 15 of the workpiece 11, and thus the workpiece 11 is fixed on the supporting plate 31 by the welded region 45. In this bonding step, the laser beam 41 is applied while the holding table 12 is rotated. Therefore the welded region 45 is formed in the shape of a circular ring that surrounds the device region 13. However, the shape and the like of the welded region 45 are not limited to this. It suffices for the welded region 45 to be formed so as to weld the workpiece 11 and the supporting plate 31 to each other at least in the peripheral surplus region 15.

After the bonding step, the processing step is performed in which the workpiece 11 fixed to the supporting plate 31 is processed. FIG. 5 is a partially sectional side view schematically showing the processing step of the processing method according to the present embodiment. Incidentally, in the present embodiment, a grinding step is shown as an example of the processing step. As shown in FIG. 5, in the processing step (grinding step), first, the undersurface 31b of the supporting plate 31 is sucked onto a holding table 18 of a grinding apparatus 16. Next, a grinding stone 22 of a grinding wheel 20 is brought into contact with the undersurface 11b of the workpiece 11 while the holding table 18 and the grinding wheel 20 are rotated relative to each other. By gradually lowering the grinding wheel 20 in this state, the side of the undersurface 11b is ground, and thus the workpiece 11 can be processed into a small thickness. In the bonding step of the processing method according to the present embodiment, the workpiece 11 is fixed on the supporting plate 31 without the use of a glue layer or an adhesive. Therefore variations in height position of the undersurface 11b as a processing object surface of the workpiece 11 can be suppressed sufficiently. Hence, the finished thickness of the workpiece 11 can be made uniform.

Incidentally, a processing step other than the grinding step may be performed. For example, a TSV (through silicon via) forming step of forming a TSV, a laser processing step of forming a modified layer within the workpiece 11, or the like can be performed in place of the grinding step. The TSV forming step, the laser processing step, or the like may be performed in addition to the grinding step.

After the processing step, the removing step is performed in which the workpiece 11 is removed from the supporting plate 31. FIG. 6A and FIG. 6B are partially sectional side views schematically showing the removing step of the processing method according to the present embodiment. Incidentally, a second mode, a third mode, or a fourth mode of the removing step which modes will be described later can also be applied to the removing step in place of a first mode of the removing step which first mode is shown in FIG. 6A and FIG. 6B.

In the removing step, as shown in FIG. 6A, first, the undersurface 31b of the supporting plate 31 is sucked onto a holding table 26 of a cutting apparatus 24. Then, a cutting blade 28 rotating at high speed is positioned on the inside of the welded region 45 and made to cut into the undersurface 11b of the workpiece 11, and the holding table 26 is rotated. The cutting depth of the cutting blade 28 is made equal to or more than the thickness of the workpiece 11 after the processing step (thickness of the wafer part, that is, the thickness excluding the bumps 21 and the like). A dividing groove 47 having such a depth as to reach the top surface 31a of the supporting plate 31 is thereby formed. The cutting blade 28 is positioned such that at least the inner circumference of the dividing groove 47 is formed closer to the central side of the workpiece 11 than the inner circumference of the welded region 45.

The central side (side of the device region 13) and the outer circumference side (side of the peripheral surplus region 15) of the workpiece 11 are divided from each other with the dividing groove 47 as a boundary. Therefore, as shown in FIG. 6B, the side of the device region 13 of the workpiece 11 can be easily removed from the supporting plate 31. In the bonding step of the processing method according to the present embodiment, the workpiece 11 is fixed on the supporting plate 31 without the use of a glue layer or an adhesive. It is therefore possible to prevent the remaining of a glue or an adhesive on the workpiece 11 removed from the supporting plate 31.

As described above, the processing method according to the present embodiment can fix the workpiece 11 on the supporting plate 31 without the use of a glue layer or an adhesive by welding the workpiece 11 and the supporting plate 31 to each other through the application of the laser beam 41. Hence, variations in height position of the undersurface 11b of the workpiece 11 which undersurface 11b is a processing object surface can be suppressed. In addition, the remaining of a glue or an adhesive on the workpiece 11 can be prevented. In addition, for example, even when a processing step such as a TSV forming step including high-temperature heat treatment is performed, the heat resistance of a glue layer or an adhesive does not present a problem. Further, because the workpiece 11 is removed from the supporting plate 31 by cutting, there is no fear that the workpiece that has been processed into a small thickness may be damaged at a time of peeling as in a case where a glue layer or an adhesive is used.

Figure 7A:
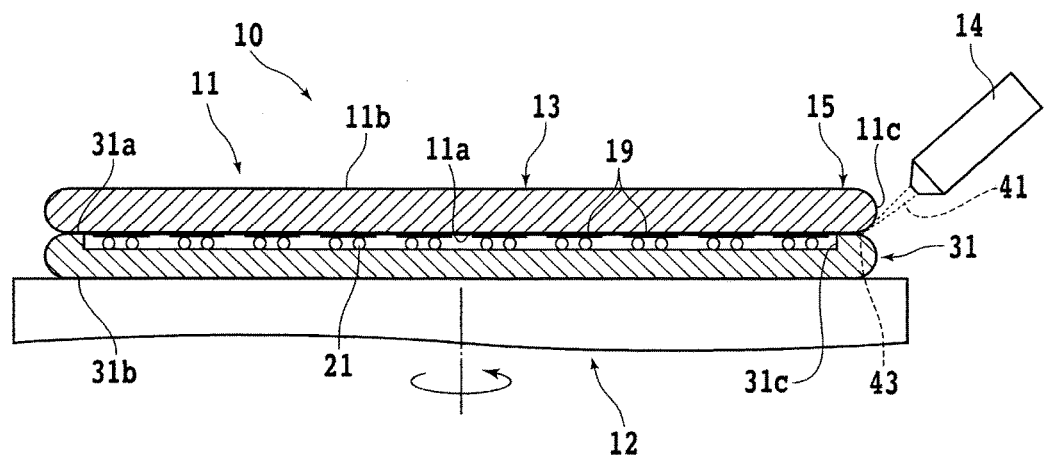
FIG. 7A and FIG. 7B are partially sectional side views schematically showing a second mode of the bonding step.
Figure 7B:
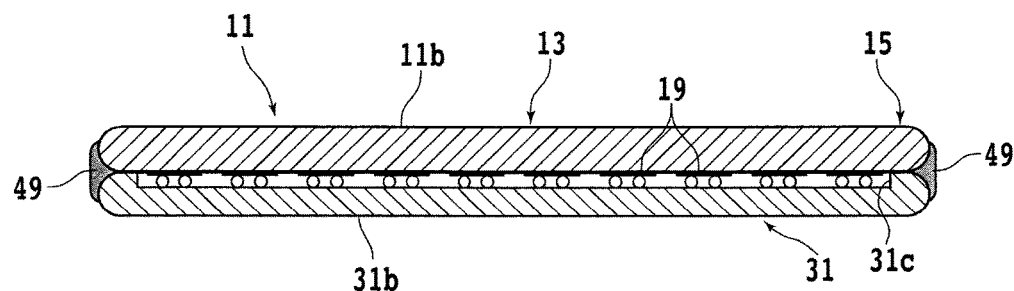
Figure 7C:
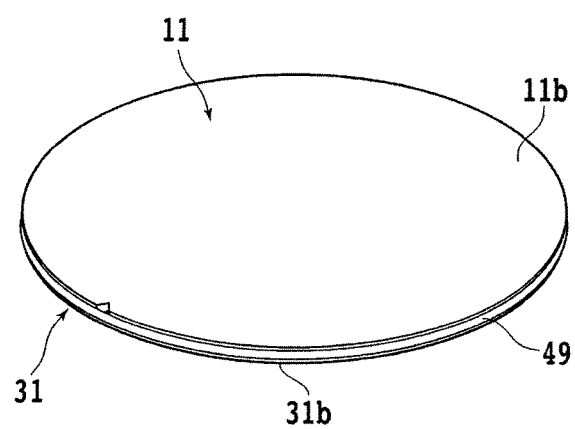
FIG. 7C is a perspective view schematically showing a state of the workpiece and the like after the bonding step according to the second mode is performed.

Incidentally, the bonding step or the removing step of the foregoing embodiment can be changed to other modes. FIG. 7A and FIG. 7B are partially sectional side views schematically showing a second mode of the bonding step. FIG. 7C is a perspective view schematically showing a state of the workpiece 11 and the like after the bonding step according to the second mode is performed. FIG. 8A and FIG. 8B, FIG. 9A and FIG. 9B, and FIG. 10A and FIG. 10B are partially sectional side views schematically showing a second mode, a third mode, and a fourth mode, respectively, of the removing step.

In the second mode of the bonding step, as shown in FIG. 7A, the undersurface 31b of the supporting plate 31 is sucked onto the holding table 12 of the laser processing apparatus 10, and thereafter the laser processing head 14 is positioned outside the outer circumference 11c of the workpiece 11. Then, the laser beam 41 is applied while the holding table 12 is rotated. The laser beam 41 is oscillated with for example YAG, YVO4, Er/Yb/Tm doped fiber or the like used as a laser medium. The laser beam 41 is applied from the side of the workpiece 11 to the interface between the workpiece 11 and the supporting plate 31. The focusing point 43 of the laser beam 41 is positioned in the vicinity of the interface between the workpiece 11 and the supporting plate 31.

As shown in FIG. 7B and FIG. 7C, when the vicinity of the interface between the workpiece 11 and the supporting plate 31 is irradiated with the laser beam 41 having a sufficient intensity, part of the side of the top surface 11a of the workpiece 11 (side of the outer circumference 11c in particular) and part of the side of the top surface 31a of the supporting plate 31 (side of the outer circumference 11c in particular) melt. As a result, a welded region 49 that welds the workpiece 11 and the supporting plate 31 to each other is formed in the peripheral surplus region 15 of the workpiece 11, or in a region including the outer circumference 11c in particular, and thus the workpiece 11 is fixed on the supporting plate 31 by the welded region 49.

Figure 8A:
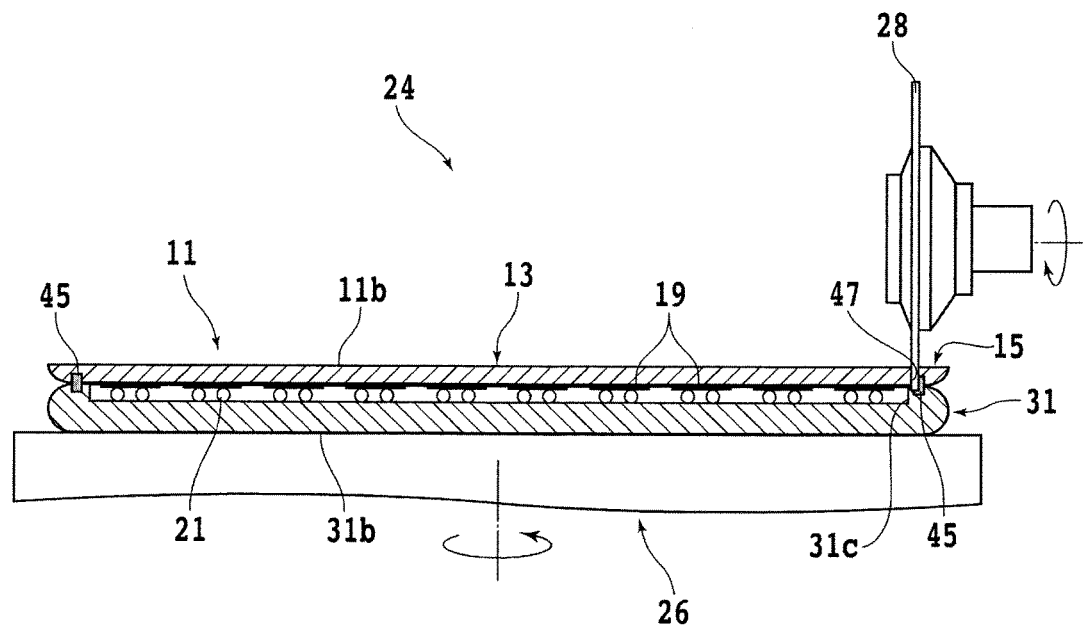
FIG. 8A and FIG. 8B are partially sectional side views schematically showing a second mode of the removing step.
Figure 8B:
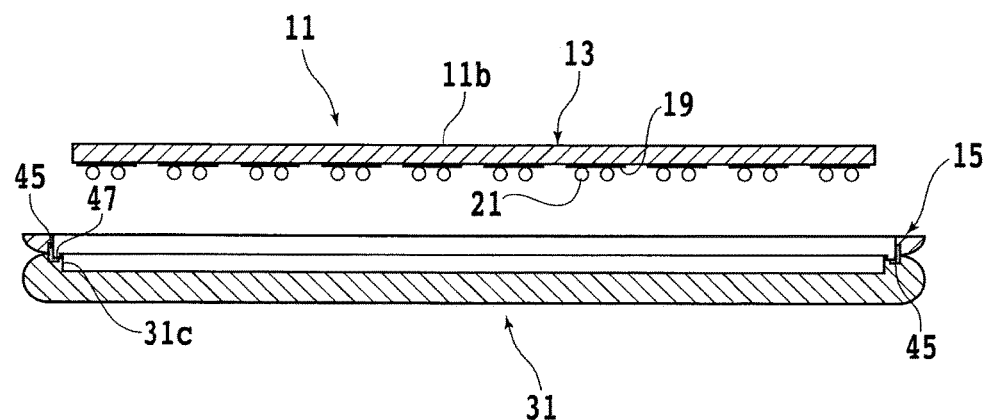

In the second mode of the removing step, as shown in FIG. 8A, the undersurface 31b of the supporting plate 31 is sucked onto the holding table 26 of the cutting apparatus 24. Then, the cutting blade 28 rotating at high speed is positioned so as to coincide with an inner edge of the welded region 45 and made to cut into the undersurface 11b of the workpiece 11, and the holding table 26 is rotated. The cutting depth of the cutting blade 28 is made equal to or more than the thickness of the workpiece 11 after the processing step (thickness of the wafer part, that is, the thickness excluding the bumps 21 and the like). A dividing groove 47 having such a depth as to reach the top surface 31a of the supporting plate 31 is thereby formed. The central side and the outer circumference side of the workpiece 11 are divided from each other with the dividing groove 47 as a boundary. Therefore, as shown in FIG. 8B, the side of the device region 13 of the workpiece 11 can be easily removed from the supporting plate 31.

Figure 9A:
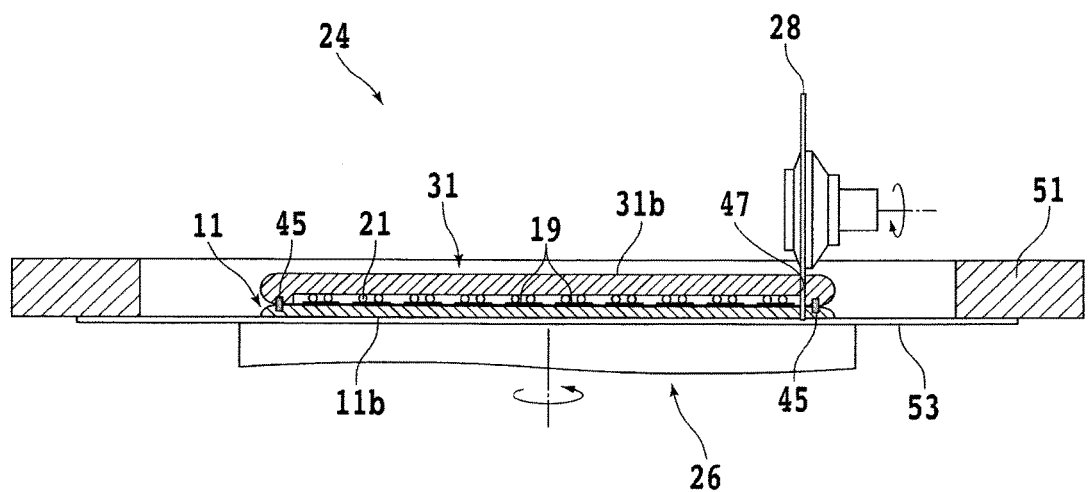
FIG. 9A and FIG. 9B are partially sectional side views schematically showing a third mode of the removing step.

In the third mode of the removing step, as shown in FIG. 9A, first, a dicing tape 53 affixed to an annular frame 51 is stuck to the undersurface 11b of the workpiece 11 fixed to the supporting plate 31. Next, the undersurface 11b of the workpiece 11 is sucked onto the holding table 26 of the cutting apparatus 24 with the dicing tape 53 interposed between the undersurface 11b of the workpiece 11 and the holding table 26 of the cutting apparatus 24. The holding table 26 is thereafter rotated. Then, the cutting blade 28 rotating at high speed is positioned on the inside of the welded region 45, and made to cut into the undersurface 31b of the supporting plate 31. The cutting depth of the cutting blade 28 is made equal to or more than a sum of the thickness of the supporting plate 31 (thickness without the recessed portion 31c being taken into consideration, that is, the thickness from the top surface 31a to the undersurface 31b) and the thickness of the workpiece 11 after the processing step (thickness of the wafer part, that is, the thickness excluding the bumps 21 and the like). A dividing groove 47 having such a depth as to reach the dicing tape 53 is thereby formed. The cutting blade 28 is positioned such that at least the inner circumference of the dividing groove 47 is formed closer to the central side of the workpiece 11 than the inner circumference of the welded region 45.

Figure 9B:
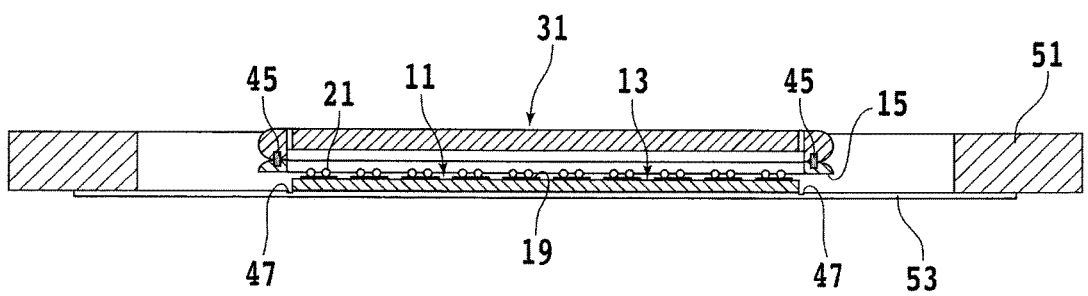

The central side and the outer circumference side of the workpiece 11 are divided from each other with the dividing groove 47 as a boundary. Therefore, as shown in FIG. 9B, the side of the device region 13 of the workpiece 11 can be easily removed from the supporting plate 31. In the third mode of the removing step, the workpiece 11 removed from the supporting plate 31 is supported by the dicing tape 53 and the frame 51. Therefore a risk of damage to the workpiece 11 at a time of handling can be lowered.

Figure 10A:
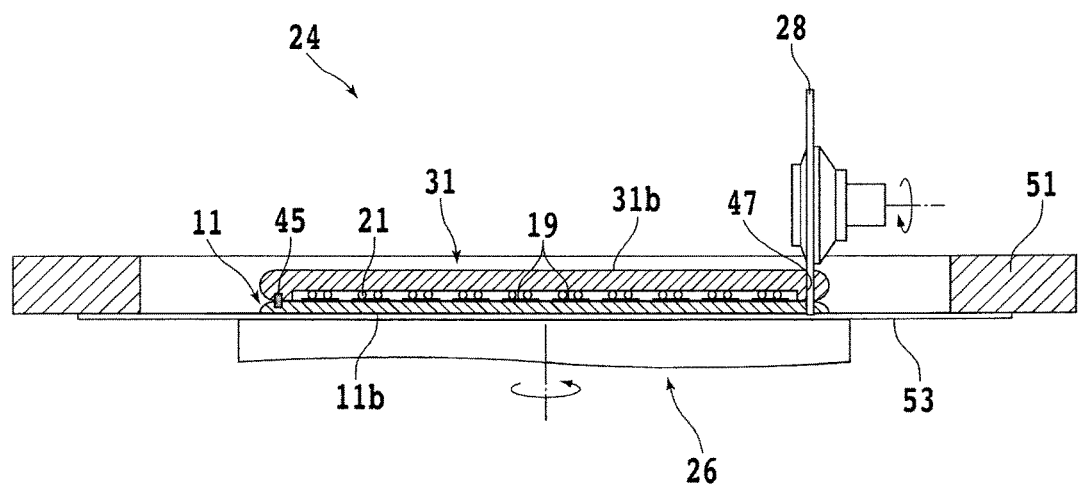
FIG. 10A and FIG. 10B are partially sectional side views schematically showing a fourth mode of the removing step.
Figure 10B:
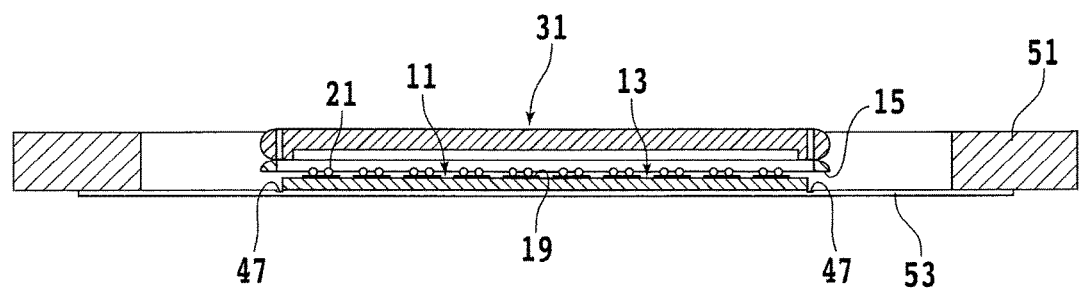

In the fourth mode of the removing step, as shown in FIG. 10A, first, a dicing tape 53 affixed to an annular frame 51 is stuck to the undersurface 11b of the workpiece 11 fixed to the supporting plate 31. Next, the undersurface 11b of the workpiece 11 is sucked onto the holding table 26 of the cutting apparatus 24 with the dicing tape 53 interposed between the undersurface 11b of the workpiece 11 and the holding table 26 of the cutting apparatus 24. The holding table 26 is thereafter rotated. Then, the cutting blade 28 rotating at high speed is positioned so as to coincide with the welded region 45, and made to cut into the undersurface 31b of the supporting plate 31. The cutting depth of the cutting blade 28 is made equal to or more than a sum of the thickness of the supporting plate 31 (thickness without the recessed portion 31c being taken into consideration, that is, the thickness from the top surface 31a to the undersurface 31b) and the thickness of the workpiece 11 after the processing step (thickness of the wafer part, that is, the thickness excluding the bumps and the like). A dividing groove 47 having such a depth as to reach the dicing tape 53 is thereby formed. Therefore, as shown in FIG. 10B, the side of the device region 13 of the workpiece 11 can be easily removed from the supporting plate 31. In the fourth mode of the removing step, as in the third mode of the removing step, the workpiece 11 removed from the supporting plate 31 is supported by the dicing tape 53 and the frame 51. Therefore a risk of damage to the workpiece 11 at a time of handling can be lowered.

It is to be noted that the present invention is not limited to the description of the foregoing embodiments, but is susceptible of various changes. For example, in the foregoing embodiments, a removing step is shown in which the workpiece 11 is removed from the supporting plate 31 by forming the dividing groove 47 with the cutting blade 28. However, the dividing groove 47 may be formed by ablation processing using the application of a laser beam.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method for processing a workpiece, the workpiece including a device region having at least one device formed on a top surface of the device region and a peripheral surplus region surrounding the device region, the workpiece having at least one projecting portion in the device region, the method comprising:
   a supporting plate preparing step of preparing a supporting plate having, on a top surface side of the supporting plate, a recessed portion configured to correspond to the device region of the workpiece and to house the projecting portion;
   a positioning step of mounting the workpiece on the supporting plate such that the recessed portion of the supporting plate and the device region of the workpiece correspond to each other, wherein the positioning step results in the workpiece being in direct contact with the supporting plate;
   a bonding step of forming a welded region in which the workpiece is welded to the supporting plate by irradiating the peripheral surplus region of the workpiece mounted on the supporting plate with a laser beam, whereby the workpiece is fixed on the supporting plate via the welded region; and
   a processing step of processing the workpiece after performing the bonding step;
   wherein the welded region is a region including a side surface of the workpiece mounted on the supporting plate; and
   wherein the welded region is formed by a laser processing head that is positioned outside of an outer circumference of the workpiece.

2. The processing method according to claim 1, further comprising:
   a removing step of removing the workpiece from the supporting plate by forming a dividing groove dividing the workpiece along the welded region after performing the processing step,
   wherein in the removing step, the dividing groove is formed such that an inner circumference of the dividing groove is positioned closer to a central side of the workpiece than an inner circumference position of the welded region.

3. The processing method according to claim 2, wherein the dividing groove formed during the removing step is formed by a cutting blade that is rotated to cut into the workpiece.

4. The processing method according to claim 2, wherein the dividing groove formed during the removing step is formed by cutting into the workpiece.

5. The processing method according to claim 1, wherein the processing step comprises grinding an undersurface of the workpiece such that the workpiece has a smaller thickness than an original thickness thereof.

6. The processing method according to claim 1, wherein the workpiece is fixed to the supporting plate without the use of a glue layer or an adhesive.

7. The processing method according to claim 1, wherein the supporting plate and the workpiece are formed of the same material.

8. The processing method according to claim 1, wherein the supporting plate and the workpiece are each formed of a silicon wafer.

* * * * *